(12) United States Patent
Parker et al.

(10) Patent No.: US 7,049,865 B2
(45) Date of Patent: May 23, 2006

(54) POWER-ON DETECT CIRCUIT FOR USE WITH MULTIPLE VOLTAGE DOMAINS

(75) Inventors: Rachael J. Parker, Forest Grove, OR (US); Mark L. Neidengard, Hillsboro, OR (US); Patrick J. Ott, Hillsboro, OR (US); Gregory F. Taylor, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/794,497

(22) Filed: Mar. 5, 2004

(65) Prior Publication Data
US 2005/0195000 A1 Sep. 8, 2005

(51) Int. Cl.
*H03L 7/00* (2006.01)

(52) U.S. Cl. .................................................. 327/143

(58) Field of Classification Search ................ 327/142, 327/143, 198, 63, 65, 69, 71, 74, 75, 76, 327/77, 80, 81, 82
See application file for complete search history.

(56) References Cited

U.S. PATENT DOCUMENTS

| 5,446,404 | A | * | 8/1995 | Badyal et al. ............... 327/143 |
| 5,677,643 | A | * | 10/1997 | Tomita ........................ 327/78 |
| 6,078,201 | A | * | 6/2000 | Crotty ........................ 327/143 |
| 6,236,250 | B1 | | 5/2001 | Salmon et al. |
| 6,281,724 | B1 | * | 8/2001 | Ellis ........................... 327/143 |
| 6,448,824 | B1 | * | 9/2002 | Rodriguez et al. ........... 327/74 |

* cited by examiner

*Primary Examiner*—Jeffrey Zweizig
(74) *Attorney, Agent, or Firm*—Schwabe, Williamson & Wyatt, P.C.

(57) ABSTRACT

Embodiments of the present invention include a circuit, a method, and a system for power-on detect circuitry for use with multiple voltage domains.

33 Claims, 5 Drawing Sheets

POWER-ON DETECT CIRCUIT FOR USE WITH MULTIPLE VOLTAGE DOMAINS

FIELD OF THE INVENTION

Disclosed embodiments of the present invention relate to the field of integrated circuits (IC), and more particularly to providing signal integrity across multiple voltage domains of the IC.

BACKGROUND OF THE INVENTION

Many types of modern electronic devices may incorporate multiple voltage domains. For example, a modern microprocessor chip may include core logic that operates in one voltage domain while interacting with input/output (I/O) circuitry operating in another.

During the initial power up sequencing the different voltage domains may reach a nominal power level at different times. If logic in a first voltage domain is required to function only when the voltages of both domains are at their nominal levels, the logic in the first voltage domain may need an indication that the signal(s) outputted by the second domain logic is(are) valid. Prior art methods have attempted to accomplish this by sending a signal through a level shifter from the second voltage domain to the first voltage domain. Unfortunately, the level shifter output may be an undefined signal if the voltage in the second voltage domain has not reached the nominal voltage level. The propagation of this undefined signal into the first voltage domain could falsely indicate that the signal(s) outputted from the second voltage domain is(are) valid.

BRIEF DESCRIPTION OF THE DRAWINGS

Embodiments of the invention are illustrated by way of example and not by way of limitation in the figures of the accompanying drawings, in which the like references indicate similar elements and in which.

DETAILED DESCRIPTION OF EMBODIMENTS OF THE INVENTION

In the following detailed description, reference is made to the accompanying drawings that form a part hereof, wherein like numerals designate like parts throughout, and in which is shown by way of illustration of specific embodiments in which the invention may be practiced. It is to be understood that other embodiments may be utilized and structural or logical changes may be made without departing from the scope of the embodiments of the present invention. Therefore, the following detailed description is not to be taken in a limiting sense and the scope of the embodiments of the present invention is defined by the appended claims and their equivalents.

FIGS. 1a–1d illustrate a power-on detect (POD) circuit 100 that may be used to assure voltage levels of multiple voltages for multiple voltage domains, in accordance with one embodiment of this invention. In particular, for this embodiment, POD circuit 100 may be used to assure the voltage levels of first (V1) and second (V2) voltage supplies for two voltage domains.

Figure 1A:
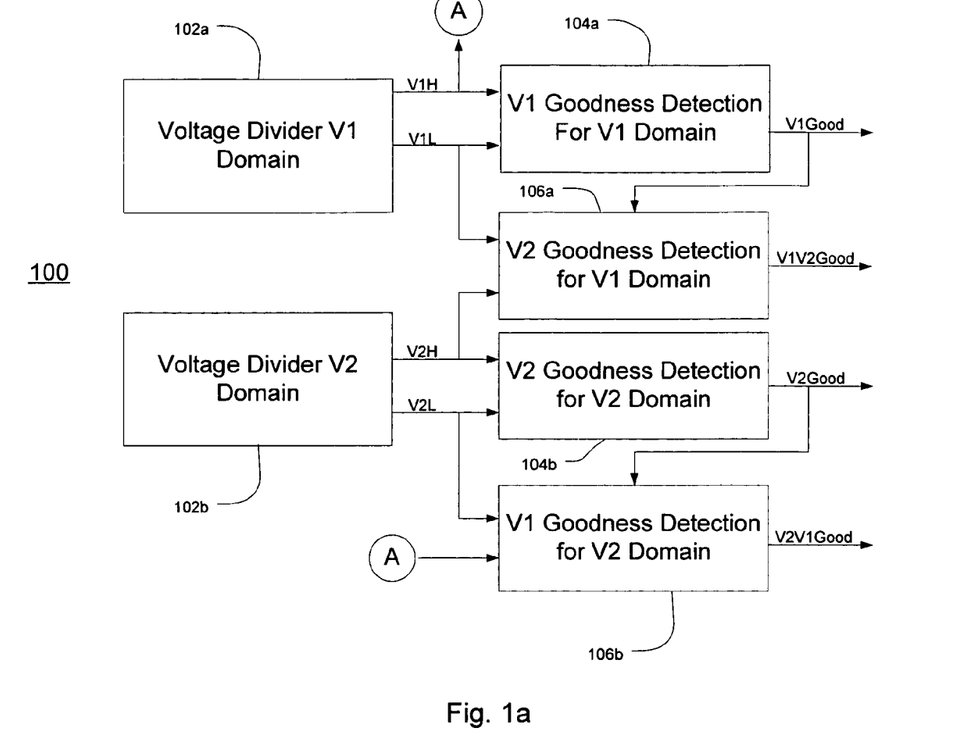
FIGS. 1a–1d illustrate a power-on detect circuit for use to assure proper voltage levels of multiple voltage supplies for multiple voltage domains, in accordance with an embodiment of the present invention.

For the embodiment, as illustrated in FIG. 1a, POD circuit 100 includes voltage dividers 102a–102b, V1 goodness detectors 104a and 106b and V2 goodness detectors 106a and 104b coupled to each other as shown. The goodness detectors 104a, 104b, 106a, and 106b may also be referred to as analyzers. Voltage divider 102a, V1 goodness detector 104a and V2 goodness detector 106a serve the V1 domain, while voltage divider 102b, V2 goodness detector 104b and V1 goodness detector 106b serve the V2 domain. Accordingly, V1 or V2 domain may also be referred to as the "client" domain of the circuit elements that serve them.

Figure 3:
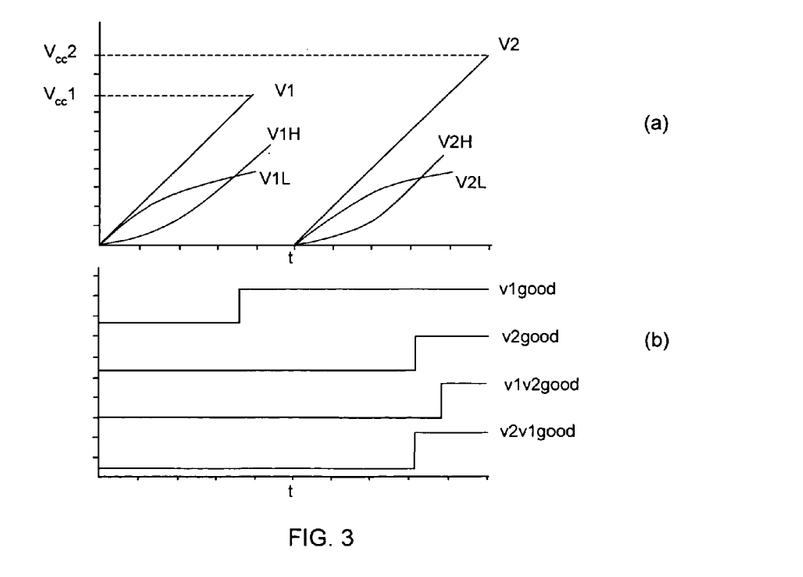
FIGS. 3a–3b illustrate various voltage levels and voltage goodness signals as a function of time, for an example sequential ramp up of two voltage supplies.

Each of the voltage dividers 102a/102b is employed to generate two proxy signals V1L and V1H (or V2L and V2H) to reflect the voltage level of voltage V1/V2 in different manners. For the embodiment V1L/V2L rises rapidly as V1/V2 rises and then plateaus out, whereas, V1H/V2H rises more slowly initially as V1/V2 rises, but then very rapidly thereafter (see also FIG. 3). Each of proxy signal pairs, V1L and V1H or V2L and V2H, is designed, such that the two proxy signals V1L/V2L and V1H/V2H equal each other when the voltage of interest V1/V2 reaches a threshold level of "goodness." The threshold level that defines goodness is application dependent, and may vary from application to application.

Each of V1/V2 voltage goodness detectors 104a/104b is employed to indicate whether the voltage level of the voltage of its client domain V1/V2 has reached the corresponding desired threshold level. In other words, V1 voltage goodness detector 104a is employed to indicate for the V1 voltage domain, whether the voltage level of the V1 voltage is good, and V2 voltage goodness detector 104b is employed to indicate for the V2 voltage domain, whether the voltage level of the V2 voltage is good. Accordingly, V1/V2 voltage goodness detector 104a/104b may also be referred to as local voltage goodness detector. As illustrated, each of V1/V2 voltage goodness detectors 104a and 104b generates its indicator based on the corresponding proxy signals, V1L and V1H or V2L and V2H.

Each of V2/V1 voltage goodness detectors 106a and 106b, on the other hand, is employed to indicate whether the voltage level of the voltage of the other voltage domain V1/V2 has reached the corresponding desired threshold level. In other words, V2 voltage goodness detector 106a is employed to indicate for the V1 voltage domain, whether the voltage level of the V2 voltage is good, and V1 voltage goodness detector 106b is employed to indicate for the V2 voltage domain, whether the voltage level of the V1 voltage is good. Accordingly, V2/V1 voltage goodness detectors 106a and 106b may also be referred to as neighbor voltage goodness detector. As illustrated, for the embodiment, each of V2/V1 voltage goodness detectors 106a and 106b generates its indicator based on two complementary proxy signals of the two domains (e.g. V2H and V1L for indicating voltage level of V2 for the V1 domain, and V1H and V2L for indicating voltage level of V1 for the V2 domain), and the voltage goodness signal of the client domain V1good/V2good.

Figure 1B:
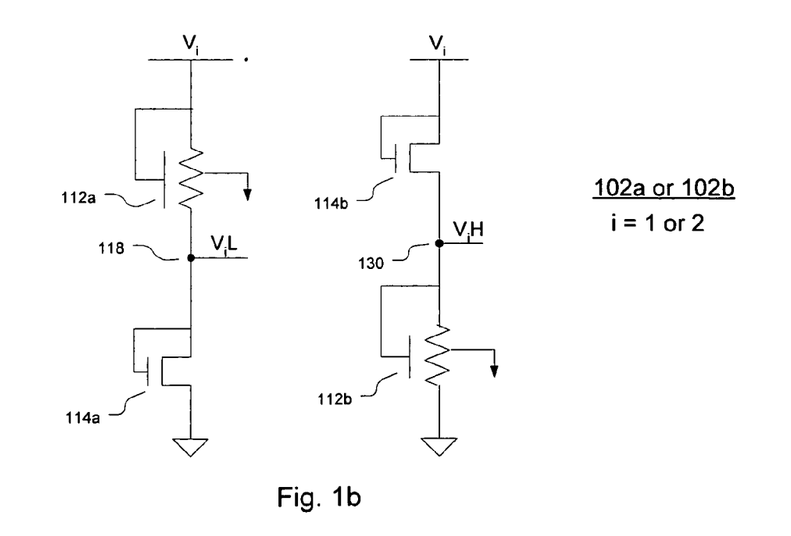

FIG. 1b illustrates a voltage divider in further detail, in accordance with one embodiment. As illustrated, for the embodiment, each of voltage dividers 102a and 102b includes two branches. The first branch of the voltage divider 102a/102b may include a linear device 112a coupled to Vi (where Vi may be V1 or V2). In one embodiment, the linear device may be any type of resistive device (e.g., a resistor). The linear device 112a may load a saturating device 114a, which may be coupled to a ground. Examples of the saturating device may include, but are not limited to, a diode and a diode-connected transistor. It should be noted that although in this embodiment ground is used as the base voltage, it is not essential and may not be so in other embodiments. As illustrated, ViL (e.g., V1L or V2L) is taken at node 118 which is disposed in between the two devices 112a and 114a. The second branch of the voltage divider may be similar to the first, except that the saturating device 114b and the linear device 112b may have an opposite orientation. ViH (e.g. V1H or V2H) is taken at node 130 disposed in between devices 114b and 112b.

With the two branches of the voltage dividers having the linear and the saturation devices in opposite positions, as the voltage supply V1/V2 is ramped from zero to its nominal level, the intermediate voltages V1H/V2H and V1L/V2L characterize V1/V2 differently as earlier described. Further, for an embodiment using grounded voltage dividers, the linear and the saturation devices are designed such that V1H/V2H and V1L/V2L may be identical at exactly one non-ground voltage, when the voltage supply V1/V2 reaches the threshold level.

Figure 1C:
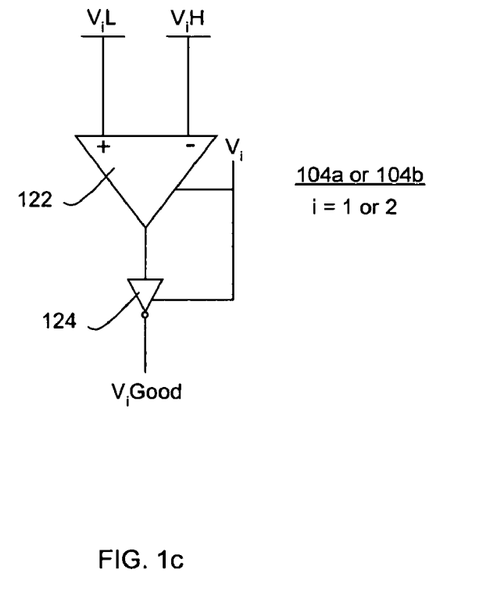

FIG. 1c illustrates the local voltage goodness detector 104a/104b in further detail, in accordance with one embodiment. Substantively, each of the local voltage goodness detectors 104a and 104b is a differential logic arrangement for detecting a condition indicating that ViH is approximately greater than ViL (e.g., V1H and V1L, or V2H and V2L). In one embodiment, the differential logical arrangement could include a voltage comparator 122 and an inverter 124, coupled to each other and to terminals manifesting voltages ViL/ViH. The terminals may correspond to nodes 118 and 130 of FIG. 1b. The terminal manifesting voltage V1L/V2L, may be coupled to, e.g., the (+) input terminal of the voltage comparator 122, whereas terminal 130, manifesting voltage V1H/V2H may be coupled to, e.g., the (−) input terminal of the voltage comparator 122. The voltage comparator 122 may be an operational amplifier. Thus, before the condition of V1H/V2H being greater than V1L/V2L, the output of comparator 122 is positive, but after the condition of V1H/V2H being greater than V1L/V2L, the output of comparator 122 is negative. Thus inverter 124 will output a positive signal indicating V1/V2 is good in the V1/V2 domain (also referred to as the V1good or V2good signal). In an alternate embodiment, the inputs on the comparator 122 may be switched and the inverter 124 removed without changing the function of the goodness detector.

Figure 1D:
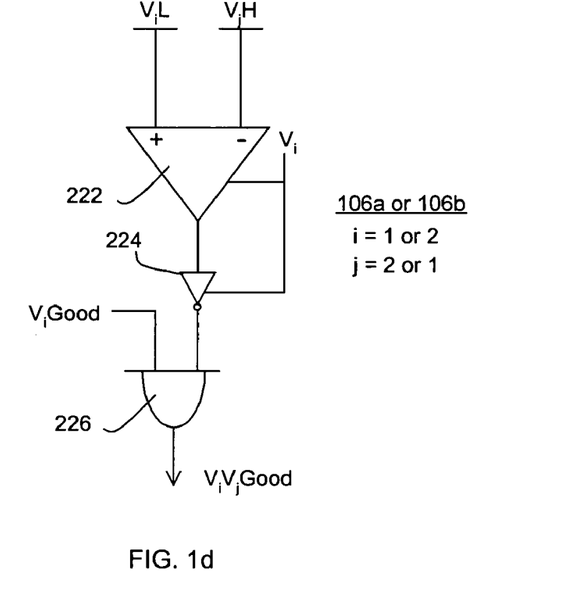

FIG. 1d illustrates the neighbor voltage goodness detector 106a/106b in further detail, in accordance with one embodiment. Similar to local voltage goodness detector 104a/104b, neighbor voltage goodness detector 106a/106b, substantively, is also a differential logic arrangement. In one embodiment, the differential logic arrangement may include comparator 222 and inverter 224 coupled to each other as shown. Comparator 222 may also be a differential amplifier. The (+) and (−) terminals of comparator 222 are coupled to two terminals manifesting two complementary proxy signals of two voltage domains (e.g., V1L and V2H or V2L and V1H) instead. Furthermore, a logic gate such as an AND gate 226 may be used to gate the output of the inverter 224 with the local voltage good indication (V1good or V2good) for the client domain. Depending on the power-up sequence of a particular embodiment, the AND gate may not be needed to gate the control signal with the local voltage good signal.

Figure 2:
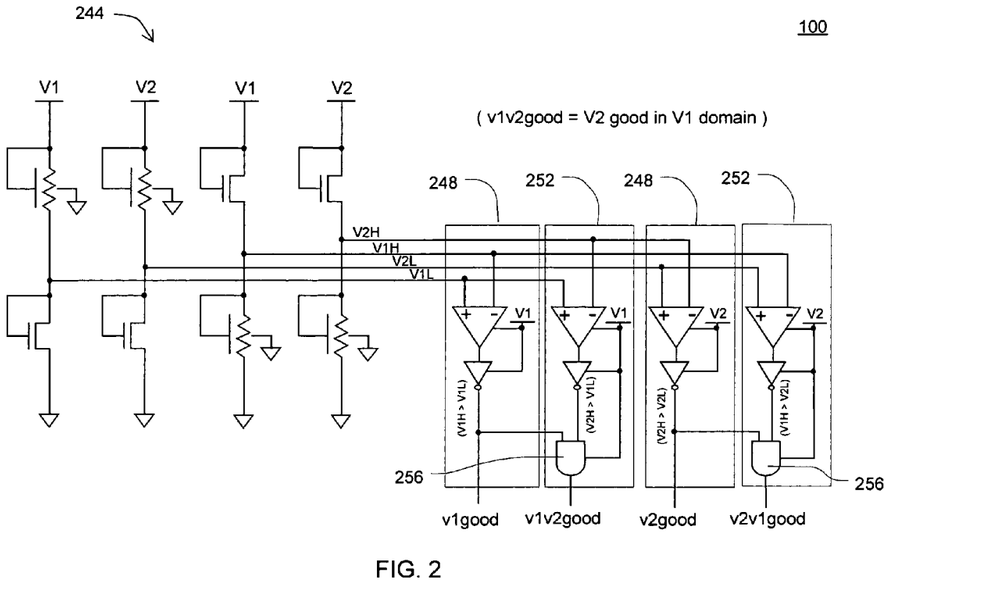
FIG. 2 illustrates an example of a power-on detect circuit described in FIGS. 1a–1d, in accordance with an embodiment of the present invention.

In summary, FIG. 2 illustrates one example of a power-on detect circuit 100 including the elements discussed with reference to FIGS. 1a–1d. This power-on detect circuit 100 may include a pair of voltage dividers 244, a pair of local voltage goodness detectors 248, and a pair of neighbor voltage goodness detectors 252 including a pair of logic gates 256. This power-on detect circuit 100 may be capable of outputting four signals including V1good, V2good, V1V2good, and V2V1good, locally assuring the V1 and V2 voltage domains that V1 and V2 have reached their respective desired threshold levels, as well as neighborly assuring the V2 and V1 voltage domains of the same. In one application, selected ones of these signals may then be used to qualify all signals transmitted across the voltage domains, to be discussed further with reference to FIG. 4.

As is common in the art, the power-on detect circuit 100 may also be described as a power detect, power-on reset, power enable, and/or voltage detect circuit. Embodiments of the present invention relate to all of the above as they are generally understood in the field.

Although the above embodiment is illustrated depicting two power-supply domains, embodiments of this invention are not limited in use to only two domains.

As illustrated in FIG. 2, the power-on detect circuit includes semiconductor devices such as saturation and linear devices. Although these semiconductor devices are illustrated schematically as single transistors/resistors, this is done to facilitate the discussion of the circuit characteristics. When implemented or manufactured these may comprise multiple devices, depending, for example, upon the application or the particular integrated circuit chip. For example, as it is well known, some form of digital and/or analog circuit compensation may be included to address the potential variation in circuit parameters known to occur as a result of the fabrication process. Therefore, the simplified circuit diagram in FIG. 2 is provided primarily for purposes of illustration and, as one of ordinary skill in the art will appreciate, when actually implementing a particular power-on detect circuit, more complex circuitry to provide a desired operation, such as operations described herein, may be employed. For example, a plurality of transistors having sizes that are binary weighted may be coupled so that each of the transistors may be switched on and off independently to "tune" the overall collection of binary weighted transistors to achieve a particular impedance or effective transistor width.

Also, certain logical functions schematically represented by a logic component should not be limited to that specific component. For example, the AND gate 226 represents the logical function of producing a certain output once two conditions have been satisfied. However, there are logical components other than an AND gate, which may be combined to produce the same function (e.g., a NAND gate followed by an inverter).

Devices that operate with multiple voltage domains may require a power-up sequence for proper initialization. In one embodiment, for example, an input/output domain may be sequenced to power-up before the core logic domain. However, this is not always the case, and other embodiments may use alternative power-up sequencing procedures. Embodiments of the present invention may be readily adapted to any number of power-up supply sequences with multiple voltage domains.

FIGS. 3a–3b further explain the timing of the signals output from the power-on detect circuit 100 in correlation to a particular power-up sequence, in accordance with one example application. FIG. 3a may depict a set of waveforms where the two voltages V1 and V2 are ramped sequentially. The different characterizations of V1 and V2 by the proxy signals V1L, V1H, V2L and V2H are as shown. FIG. 3b depicts the binary signals that may be emitted from the differential logic arrangements to denote the goodness of the local or neighbor voltage. The V1good signal may be turned on after V1H is greater than V1L. Similarly, the V2good signal may be turned on after V2H is greater than V2L. Both of these signals indicate that, in their respective voltage domains, the voltage has reached the desired nominal level.

In this embodiment, the V1V2good signal may not be turned on until V2H becomes greater than V1L. This may give an indication in the first voltage domain that the neighbor voltage V2 has reached the desired nominal level. The V1V2good signal may also need the V1good signal; however, because of the power-up sequence of this embodiment, this signal may have already been generated earlier and therefore V2H>V1L is the final condition for the V1V2good signal. The V2V1good signal may work in the opposite way. That is, the V1H signal being greater than the V2L happens early in the sequence; however, the V2good signal has not been issued yet. Therefore, the V2good signal is the final event prior to the V2V1good signal.

Figure 4:
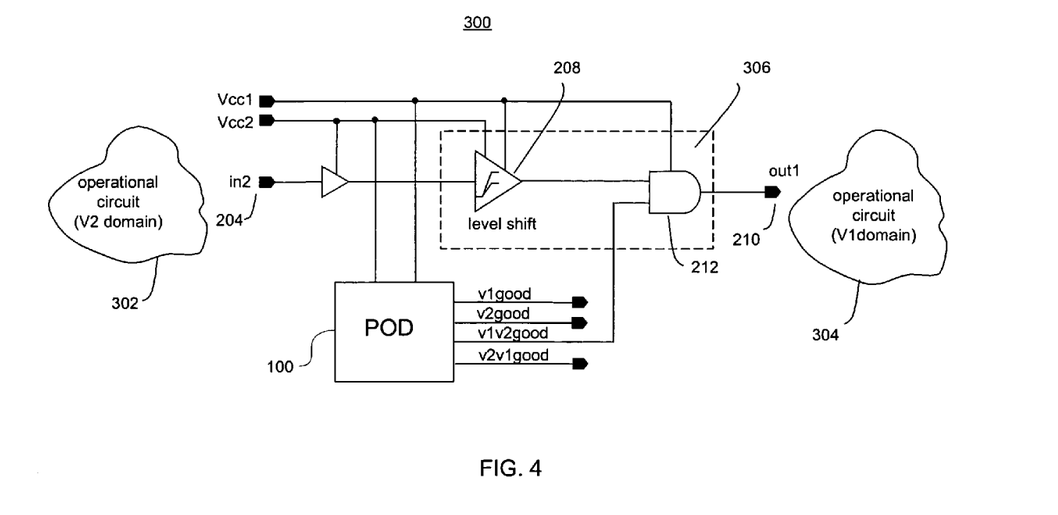
FIG. 4 illustrates an integrated circuit with multiple voltage supplies, multiple operational circuits operating in multiple voltage domains, a level shifter circuit, and a power-on detect circuit, in accordance with an embodiment of the present invention.

FIG. 4 depicts an integrated circuit incorporated with an implementation of the power-on detect circuit 100, in accordance with one embodiment. As illustrated, integrated circuit 300 includes an operational circuit 302 designed to operate with voltage V2, defining the V2 voltage domain, and another operational circuit 304 designed to operate with voltage V1, defining the V1 voltage domain. For the embodiment, in addition to operational circuits 302 and 304 and POD 100, integrated circuit 300 also includes level shift arrangement 306 to facilitate transmission of signals from the V2 voltage domain to the V1 voltage domain.

In particular, POD 100 is used to qualify any signal transitioning between the two voltage domains. For the embodiment, level shift arrangement 306 includes level shifter 208 and AND gate 212 coupled to each other and the other elements as shown. In this embodiment, a logic signal, in2 204, may be input from the V2 voltage domain. In2 204 may enter a level shifter 208 to be shifted from the V2 voltage domain into the V1 voltage domain. The output may be gated after the level shifter 208 by a control signal indicating that the V2 voltage has reached the desired nominal level, e.g. V1V2good, using AND gate 212. When the AND gate 212 receives the control signal it may provide a level shifted logic signal, out1 210, to operational circuit 304 of the V1 voltage domain. The arrangement may help to reduce the propagation of an X (unknown signal) by the level shifter 208 for the case where the destination voltage supply (e.g., V1) is valid but the driving supply (e.g., V2) is not. In various embodiments, integrated circuit 300 is a general purpose microprocessor, operational circuit 304 may be the core logic of the microprocessor, while operational circuit 302 may be the I/O section of the microprocessor.

Figure 5:
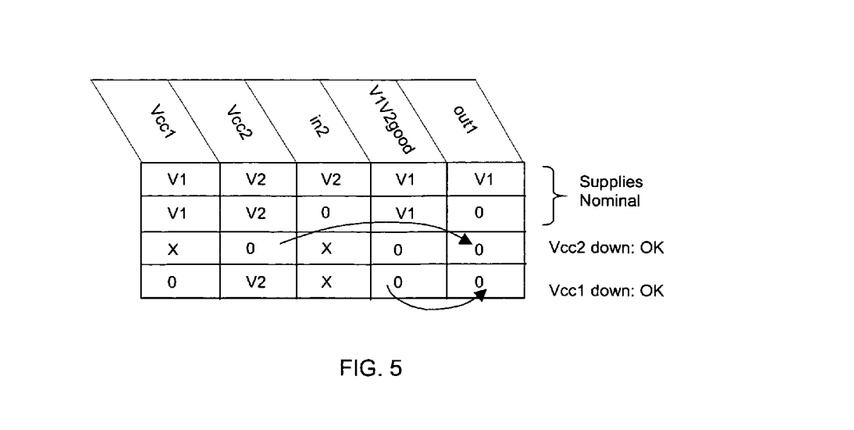
FIG. 5 represents a truth table corresponding to the level shifter circuit diagram in FIG. 4, in accordance with one embodiment of the present invention.

FIG. 5 illustrates a truth table depicting the state of the logical outputs (out1) of FIG. 4 under various conditions, in accordance with one embodiment. If the voltage in the V1 voltage domain is indeed V1 and the voltage in the V2 voltage domain is also indeed V2, then by virtue of the power-on detect circuit outputting a V1V2good signal, output out1 will be valid accordingly. That is, under these conditions, if in2 is V2, then out1 will be V1. Conversely, if in2 is 0, then out1 will also be 0. However, if either voltage (V1 or V2) is 0, then by virtue of the fact that V1V2good will also be 0, regardless of what in2 is, out1 will be 0. Therefore, the occurrence of an undefined X propagated as out1 may be reduced.

Figure 6:
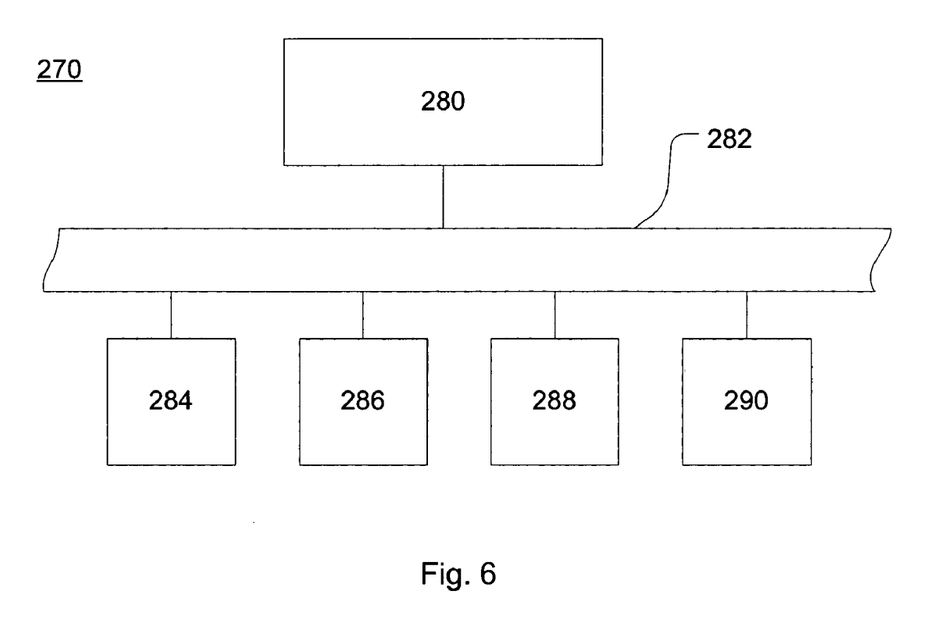
FIG. 6 illustrates a system using a power-on detect circuit, in accordance with one embodiment of the present invention.

Referring to FIG. 6, there is illustrated one of many possible systems in which embodiments of the present invention may be used. As illustrated, system 270 includes integrated circuit 280, and a number of other components and/or input/output devices. The integrated circuit 280 may be coupled to the other components and the input/output devices by means of a bus 282. A power-on detect circuit, similar to the earlier discussed embodiments, may be incorporated with integrated circuit 280 to validate signals transferring between different domains of the integrated circuit 280.

The other components may include memory 284, a graphics processor 286, a mass storage device 288, and the input/output devices may include, e.g., a network interface 290. Examples of the memory 284 include but are not limited to static random access memory (SRAM) and dynamic random access memory (DRAM). Examples of the mass storage device 288 include but are not limited to a hard disk drive, a compact disk drive (CD), a digital versatile disk drive (DVD), and so forth. Examples of other input/output modules 290 include but are not limited to a keyboard, cursor control devices, a display, a network interface, and so forth. Examples of the bus 282 include but are not limited to a peripheral control interface (PCI) bus, and Industry Standard Architecture (ISA) bus, and so forth. In various embodiments, the system 270 may be a wireless mobile phone, a personal digital assistant, a pocket PC, a tablet PC, a notebook PC, a desktop computer, a set-top box, an audio/video controller, a DVD player, and a server.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A circuit comprising:
   a first terminal adapted to manifest a first proxy signal that reflects a first level of a first voltage source of a first voltage domain;
   a second terminal adapted to manifest a second proxy signal at a second level of a second voltage source of a second voltage domain; and a first analyzer, coupled to the first and second terminals, adapted to receive the first and second proxy signals and to generate, in response, a first control signal indicative for said first voltage domain, whether the second voltage source has reached a first threshold level in said second voltage domain.

2. The circuit of claim 1 wherein a goodness of information sent from the second domain to the first domain is conveyed to the first domain based at least in part on the control signal.

3. The circuit of claim 1, wherein the first proxy signal is at the first level of the first voltage.

4. The circuit of claim 1, wherein the first analyzer is equipped to detect for a condition indicating that the second proxy signal is approximately greater than the first proxy signal, and to generate the first control signal upon detection of the condition.

5. The circuit of claim 1, wherein the first analyzer comprises:
a comparator adapted to receive the first and second proxy signals and to generate, in response, a difference signal; and
an inverter, coupled to the comparator, adapted to receive the difference signal and to generate, in response, the first control signal.

6. The circuit of claim 1, further comprising:
a third terminal adapted to manifest a third proxy signal that reflects a second level of the first voltage source of the first voltage domain;
a second analyzer, coupled to the first and third terminals, adapted to receive the first and third proxy signal and to generate, in response, a second control signal indicative of whether the first voltage source has reached a second threshold level in said first voltage domain; and
the first analyzer including a first logic gate, coupled to the second analyzer, adapted to receive the second control signal and to generate, in response, the first control signal.

7. The circuit of claim 6, wherein the second analyzer is equipped to detect for a condition indicating that the third proxy signal is approximately greater than the first proxy signal and to generate the second control signal upon detection of the condition.

8. The circuit of claim 6, wherein the second analyzer comprises:
a comparator adapted to receive the first and third proxy signals and to generate, in response, a difference signal; and
an inverter, coupled to the comparator, adapted to receive the difference signal and to generate, in response, the second control signal.

9. The circuit of claim 8, wherein the first logic gate comprises:
an AND gate, coupled to the inverter, adapted to receive the first and second control signals and to generate, in response, the first control signal.

10. The circuit of claim 6, further comprising:
a first voltage divider adapted to be applied with the first voltage source and to generate, in response, the first and third proxy signals; and
a second voltage divider adapted to be applied with the second voltage source and to generate, in response, the second proxy signal and a fourth proxy signal.

11. The circuit of claim 10, wherein
the first and second voltage dividers are coupled to a ground;
the first and third proxy signals are equal at only one, non-ground, voltage; and
the second and fourth proxy signals are equal at only one, non-ground, voltage.

12. The circuit of claim 10, wherein the first voltage divider comprises:
a first branch including a first linear device and a first saturation device coupled in series with the first linear device, with the first proxy signal being taken at a first node located in between the first linear device and the first saturation device, the first node being coupled to the first terminal; and
a second branch including a second saturation device and a second linear device coupled in series with the second saturation device, with the third proxy signal being taken at a second node located in between the second saturation device and the second linear device, the second node being coupled to the third terminal.

13. The circuit of claim 12, wherein the second voltage divider comprises:
a first branch including a first saturation device and a first linear device coupled in series with the first saturation device, with the second proxy signal being taken at a first node located in between the first saturation device and the first linear device, said first node of the second voltage divider coupled to the second terminal; and
a second branch including a second linear device and a second saturation device coupled in series with the second linear device, with the fourth proxy signal being taken at a second node located in between the second linear device and the second saturation device.

14. The circuit of claim 13, wherein at least a selected one of the first and second linear devices of the first and second voltage dividers comprise a resistor.

15. The circuit of claim 13, wherein at least a selected one of the first and second saturating devices of the first and second voltage dividers comprise a diode connected transistor.

16. The circuit of claim 13, wherein the circuit further comprises:
a fourth terminal coupled to the second node of the second voltage divider, adapted to manifest the fourth proxy signal, which reflects a first level of the second voltage source of the second voltage domain; and
a third analyzer, coupled to the third and fourth terminals, adapted to receive the third and a fourth proxy signal and to generate, in response, a third control signal indicative for said second voltage domain, whether the first voltage source has reached the second threshold level in said first voltage domain.

17. The circuit of claim 16, further comprising:
a fourth analyzer, coupled to the second and fourth terminals, adapted to receive the second and fourth proxy signals and to generate, in response, a fourth control signal indicative of whether the second voltage source has reached the first threshold level in said second voltage domain; and
the third analyzer including a second logic gate, coupled to the fourth analyzer, adapted to receive the fourth control signal and to generate, in response, the third control signal.

18. An integrated circuit comprising:
a first operational circuit, coupled to a first voltage source, adapted to receive a first voltage from the first voltage source, defining a first voltage domain;

a second operational circuit, coupled to a second voltage source, adapted to receive a second voltage from the second voltage source, defining a second voltage domain; and a power-on detect circuit, coupled to the first and second voltage sources, adapted to output a first control signal for the first voltage domain indicating whether the second voltage has reached a first threshold level in the second voltage domain.

19. The integrated circuit of claim 18, wherein the power-on detect circuit is further adapted to output a second control signal indicating for the first voltage domain whether the first voltage has reached a second threshold level.

20. The integrated circuit of claim 18, wherein the power-on detect circuit is further adapted to output a second control signal indicating for the second voltage domain whether the first voltage has reached a second threshold level in the first voltage domain.

21. The integrated circuit of claim 18, wherein the power-on detect circuit is further adapted to output a third and a fourth control signal indicating for the first and second voltage domains whether the first and the second voltages have reached the second and first threshold levels in the first and second voltage domains, respectively.

22. The integrated circuit of claim 18, wherein the first voltage domain and the second voltage domain comprise different voltage levels, the circuit further comprising:

a level shifter circuit, coupled to the first and second operational circuits and the power-on detect circuit, adapted to facilitate transmission of a logic signal to the first operational circuit of the first voltage domain from the second operational circuit of the second voltage domain.

23. The integrated circuit of claim 18, wherein the integrated circuit is a microprocessor, the first operational circuit is a core logic of the microprocessor, and the second operational circuit is an I/O section of the microprocessor.

24. A method comprising:

receiving a first control signal from a power-on detect circuit coupled to receive a first and second voltage from a first and second voltage source which respectively define a first and second voltage domain, said first control signal indicating, for the first voltage domain, that the second voltage has reached a first threshold level in the second voltage domain;

receiving a first logic signal from an operational circuit of the second voltage domain;

qualifying the first logic signal with the first control signal; and transmitting a second logic signal to an operational circuit of the first voltage domain.

25. The method of claim 24, wherein the first control signal is received at some point when a first level of the first voltage of the first voltage domain is approximately less than a second level of the second voltage of the second voltage domain.

26. The method of claim 25, further comprising:

applying the first voltage to a first branch of a first voltage divider including a first linear device coupled in series to a first saturation device; and measuring the first level of the first voltage at a node between the first linear device and the first saturation device of the first branch of the first voltage divider;

applying the second voltage to a first branch of a second voltage divider including a saturation device coupled in series to a first linear device; and measuring the second level of the second voltage at a node between the first saturation device and the first linear device of the first branch of the second voltage divider.

27. The method of claim 26, further comprising:

qualifying the first logic signal with a second control signal indicating that the first voltage has reached a second threshold level in the first voltage domain; and generating the second control signal at some point when a second level of the first voltage is approximately greater than the first level of the first voltage.

28. The method of claim 27, further comprising:

applying the first voltage to a second branch of the first voltage divider including a second saturation device coupled to a second linear device; and measuring the second level of the first voltage at a node between the second saturation device and the second linear device of the second branch of the first voltage divider.

29. The method of claim 24, wherein the first logic signal from the second voltage domain is sent into the first voltage domain through a voltage level shifter.

30. A system comprising:

an integrated circuit including;

a first operational circuit, coupled to a first voltage source, adapted to receive a first voltage from the first voltage source, defining a first voltage domain;

a second operational circuit, coupled to a second voltage source, adapted to receive a second voltage from the second voltage source, defining a second voltage domain; and a power-on detect circuit, coupled to the first and second voltage sources, adapted to output a first control signal for the first voltage domain indicating whether the second voltage has reached a first threshold level In the second voltage domain; and a dynamic random access memory coupled to the second operational circuit of the integrated circuit; and an input/output interface coupled to the second operational circuit of the integrated circuit.

31. The system of claim 30, wherein the integrated circuit is a microprocessor, the first operational circuit is a core logic of the microprocessor, and the second operational circuit is an input/output section of the microprocessor.

32. The system of claim 30, wherein the input/output interface comprises a networking interface.

33. The system of claim 31, wherein the system is selected from a group consisting of a set-top box, an audio/video controller, and a DVD player.

* * * * *

UNITED STATES PATENT AND TRADEMARK OFFICE
CERTIFICATE OF CORRECTION

PATENT NO. : 7,049,865 B2  
APPLICATION NO. : 10/794497  
DATED : May 23, 2006  
INVENTOR(S) : Rachael J. Parker et al.

Page 1 of 1

It is certified that error appears in the above-identified patent and that said Letters Patent is hereby corrected as shown below:

Column 7  
Line 35, "...logic gale,..." should read --...logic gate,...--.

Column 8  
Line 42, "...terminal coupled..." should read --...terminal, coupled...--.

Column 9  
Line 19, "...of claim 18,..." should read --...of claim 20,...--.

Column 10  
Line 44, "...level In the..." should read --..level in the...--.

Signed and Sealed this

Twenty-first Day of August, 2007

JON W. DUDAS  
*Director of the United States Patent and Trademark Office*